(12) United States Patent
Nosowicz

(10) Patent No.: US 7,103,857 B2
(45) Date of Patent: Sep. 5, 2006

(54) METHOD AND LATCH CIRCUIT FOR IMPLEMENTING ENHANCED PERFORMANCE WITH REDUCED QUIESCENT POWER DISSIPATION USING MIXED THRESHOLD CMOS DEVICES

(75) Inventor: Eugene James Nosowicz, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 10/731,071

(22) Filed: Dec. 9, 2003

(65) Prior Publication Data

US 2005/0149766 A1    Jul. 7, 2005

(51) Int. Cl.
*G06F 17/50* (2006.01)
(52) U.S. Cl. .............................................. 716/2; 716/1
(58) Field of Classification Search .................. 716/2, 716/1
See application file for complete search history.

(56) References Cited

U.S. PATENT DOCUMENTS

| | | | | |
|---|---|---|---|---|
| 5,629,638 A | * | 5/1997 | Kumar | 326/121 |
| 5,774,367 A | * | 6/1998 | Reyes et al. | 716/2 |
| 5,982,211 A | * | 11/1999 | Ko | 327/202 |
| 6,090,153 A | * | 7/2000 | Chen et al. | 716/8 |
| 6,794,914 B1 | * | 9/2004 | Sani et al. | 327/202 |

* cited by examiner

*Primary Examiner*—Paul Dinh
*Assistant Examiner*—Tuyen To
(74) *Attorney, Agent, or Firm*—Joan Pennington

(57) ABSTRACT

A method and latch circuit for implementing enhanced performance includes critical data and clock paths and non-critical sections. A low voltage threshold (LVT) transistor is used only in the critical data and clock paths. The non-critical sections are implemented with regular VT, (RVT), or low leakage (LLD) transistors. The latch circuit advantageously is implemented using LVT devices in the internal critical paths of the latch and RVT output buffer transistors.

16 Claims, 8 Drawing Sheets

FIG. 7
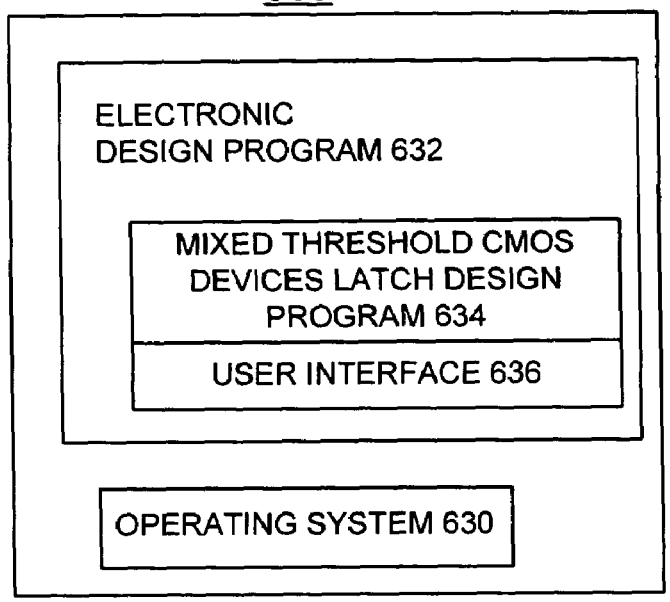
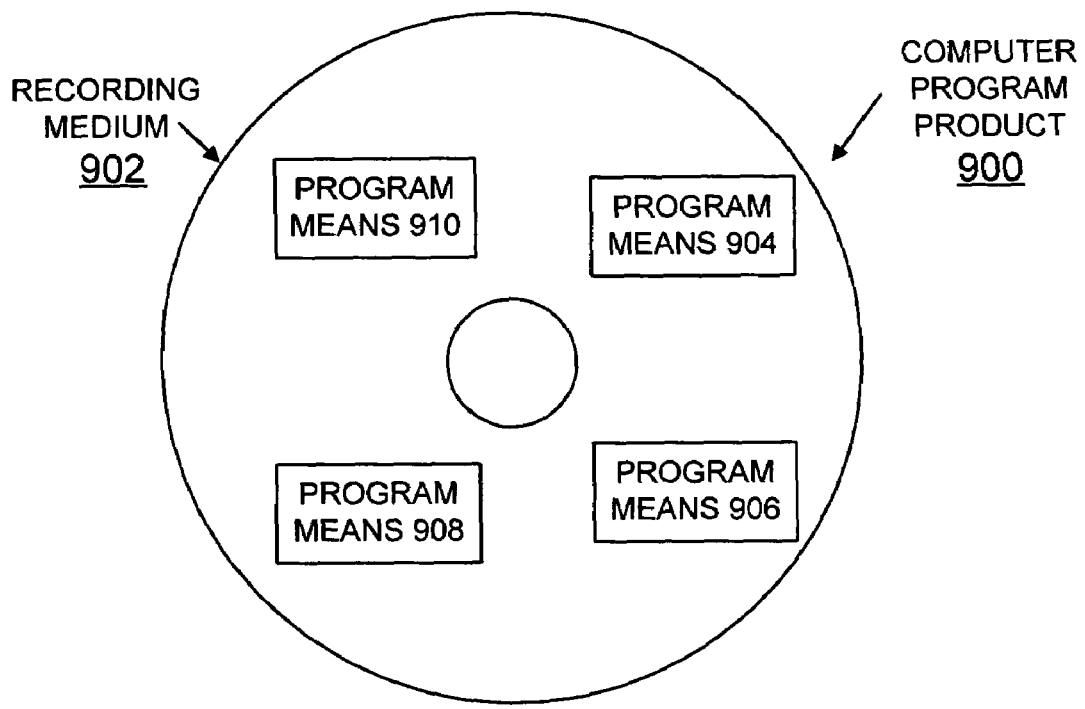
FIG. 9

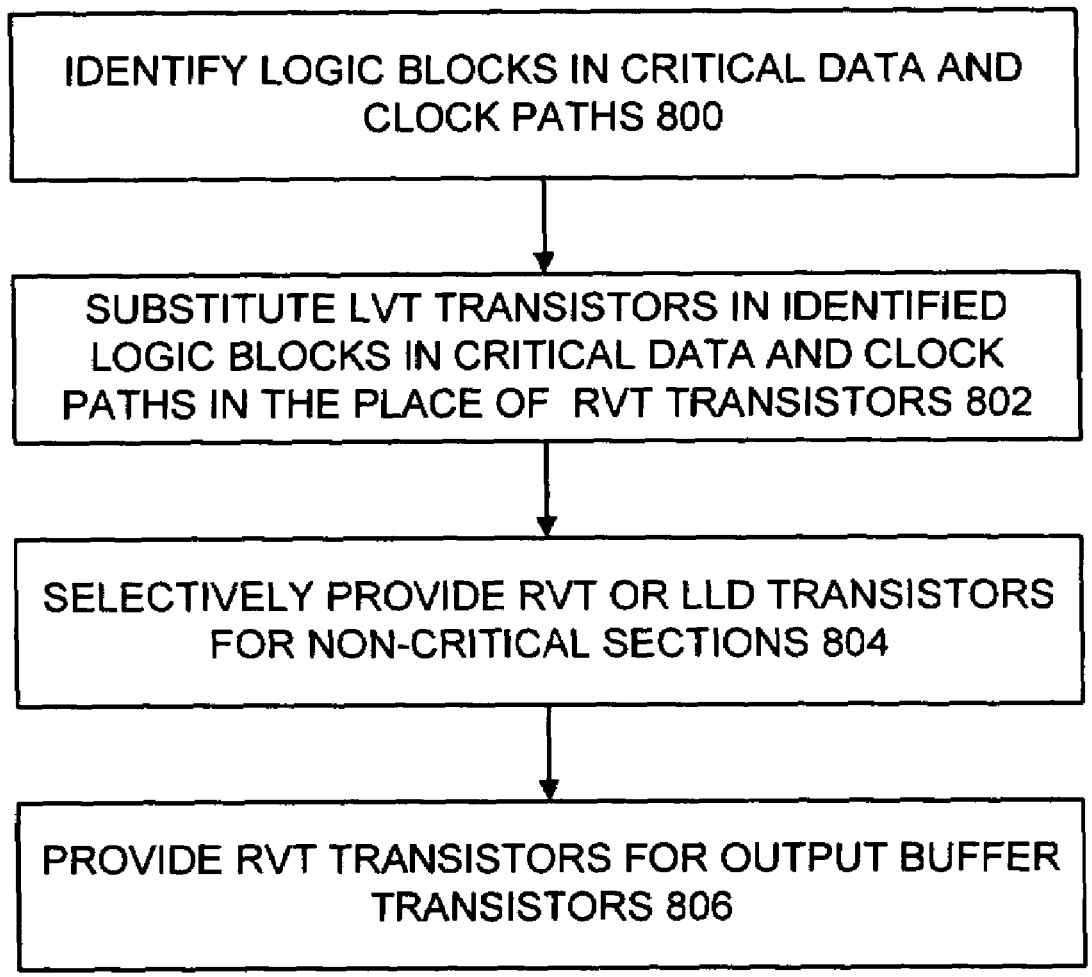

7,103,857 B2

METHOD AND LATCH CIRCUIT FOR IMPLEMENTING ENHANCED PERFORMANCE WITH REDUCED QUIESCENT POWER DISSIPATION USING MIXED THRESHOLD CMOS DEVICES

FIELD OF THE INVENTION

The present invention relates generally to the data processing field, and more particularly, relates to a method, computer program product, and latch circuit for implementing enhanced performance with reduced quiescent power dissipation using mixed threshold CMOS devices including level sensitive scan design (LSSD) latches.

DESCRIPTION OF THE RELATED ART

New complementary metal oxide semiconductor (CMOS) technologies provide the capability to mix devices with varying voltage threshold (VT) characteristics on the same chip. The newer families tend to offer at least three device types for a given semiconductor process.

These device types will be referred to as regular VT, (RVT), low VT (LVT) and low leakage (LLD) devices. Typically, RVT devices will be used in a normal circuit design. For high performance paths, circuits comprised of 100% LVT devices can be substituted for their normal and longer delay RVT counterparts. A disadvantage of this approach is that quiescent power increases when the leakage current of the LVT implementation is compared to that of the RVT version.

This increase in quiescent power dissipation can be over a factor of 4 for circuits implemented with LVT devices as compared to circuits implemented with RVT devices for nominal process, voltage and temperature conditions. LLD implementation of equivalent circuits can be used in logic paths that are not critically constrained by timing and a decrease in leakage current associated with these circuits will be gained.

Typically, there are three categories of circuit implementations corresponding to each of the device types. Each implementation will be constructed from all LVT, RVT or LLD transistors for a given circuit. That is, a latch will contain only LVT, RVT or LLD transistors.

SUMMARY OF THE INVENTION

A principal object of the present invention is to provide a method, computer program product, and latch circuit for implementing enhanced performance with reduced quiescent power dissipation using mixed threshold CMOS devices. Other important objects of the present invention are to provide such method and latch circuit for implementing enhanced performance with reduced quiescent power dissipation using mixed threshold CMOS devices substantially without negative effect and that overcome many of the disadvantages of prior art arrangements.

In brief, a method, computer program product, and latch circuit are provided for implementing enhanced performance with reduced quiescent power dissipation using mixed threshold CMOS devices. A latch circuit includes critical data and clock paths and non-critical sections. A low voltage threshold (LVT) transistor is used only in the critical data and clock paths. The non-critical sections are implemented with regular VT, (RVT), or low leakage (LLD) transistors.

In accordance with features of the invention, the latch circuit advantageously is implemented using LVT devices in the internal critical paths of the latch and RVT output buffer transistors. The latch circuit includes a level sensitive scan design (LSSD) latch.

BRIEF DESCRIPTION OF THE DRAWINGS

The present invention together with the above and other objects and advantages may best be understood from the following detailed description of the preferred embodiments of the invention illustrated in the drawings, wherein:

FIGS. 6 and 7 are block diagram representations illustrating a computer system and operating system for implementing methods for implementing enhanced performance with reduced quiescent power dissipation using mixed threshold CMOS devices in a latch circuit in accordance with the preferred embodiment;

FIG. 8 is a flow chart illustrating exemplary steps for implementing enhanced performance with reduced quiescent power dissipation using mixed threshold CMOS devices in a latch circuit in accordance with the preferred embodiment; and FIG. 9 is a block diagram illustrating a computer program product in accordance with the preferred embodiment.

DETAILED DESCRIPTION OF THE PREFERRED EMBODIMENTS

In accordance with features of the preferred embodiment, a method is provides the basis for a family of latches that uses a mixture of devices in the same latch. That is to say that LVT and RVT transistors or LVT and LLD transistors are mixed in the same circuit. The result is that the performance of the LVT latches is maintained, or actually slightly improved, by fabricating a latch that mixes LVT and LLD or RVT transistor devices. The LVT transistors are used only in the critical data and clock paths of the latch. LLD or RVT devices are used in the non-critical sections of the latch. The non-critical sections include those components used only during test and those components used to maintain the contents of the latches. The result is that the leakage current increases, for example, by only a factor of 2.4 when compared to a latch consisting of only RVT transistors while improving delay characteristics.

In accordance with features of the preferred embodiment, similarly since the output buffers in the latch contain the largest devices and contribute highly to the leakage, a circuit advantageously also is implemented using LVT devices in the internal critical paths of the latch and RVT output buffer transistors. This provides a delay that falls between those of the mixed device latch and a full RVT latch configuration at a lower cost in leakage current.

Figure 1:
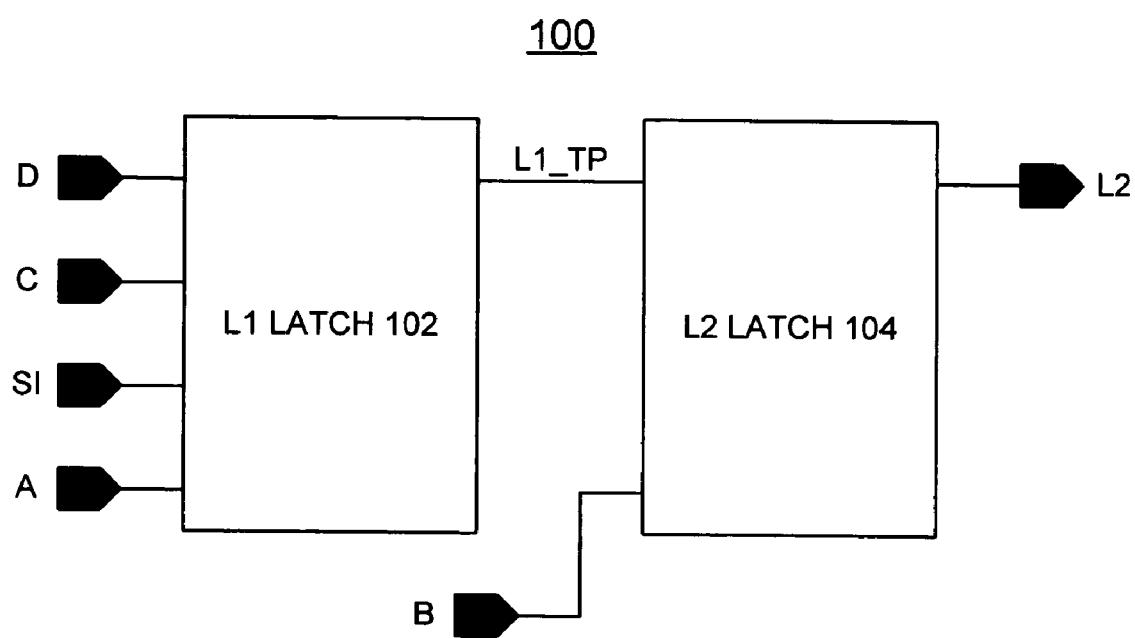
FIG. 1 is a block diagram of an exemplary level sensitive scan design (LSSD) latch implemented in accordance with a method of the preferred embodiment.

Referring now to the drawings, in FIG. 1 there is shown an exemplary level sensitive scan design (LSSD) latch generally designated by the reference character 100 implemented in accordance with a method of the preferred embodiment. The LSSD latch 100 is used to demonstrate an exemplary implementation of the method and latch circuit of the invention. It should be understood that the present invention is not limited to the illustrated LSSD latch 100, for example, various differing input and output configurations and drive options can be provided. It should be understood that the present invention can also be applied to various pulsed latch families of latches, clock splitters, clock pulsers, and the like, where only critical paths are implemented using LVT transistors to achieve maximum performance with reduced power due to reduced leakage current.

LSSD latch 100 consists of a pair of memory devices, the L1 stage or L1 latch 102 and L2 stage or L2 latch 104. The shift register latch or LSSD latch 100 including the two internal latches L1 latch 102, L2 latch 104.

Latch L1 102 has two input ports, scan in data SI and data in D, a pair of mutually exclusive clocks A and C, and an output L1_TP. When the clock A is active, the scan in data SI becomes the content of the latch. This path is only used during relatively low speed testing.

When the clock C is active, the Data in D value is loaded into the latch. The output of the L1 latch 102 for the illustrated implementation is the invert of the contents of the L1 latch. The scan path (A:S1) is a non-critical path since it is not exercised at functional speeds. The L2 Latch 104 has a single external input, clock B, and when clock B is active, the content of the L1 latch 102 is transferred into the L2 latch 104. The common implementation of logic alternates the clocks C and B during normal operation and the output of the L2 latch 104 is used to drive subsequent logic.

Figure 2:
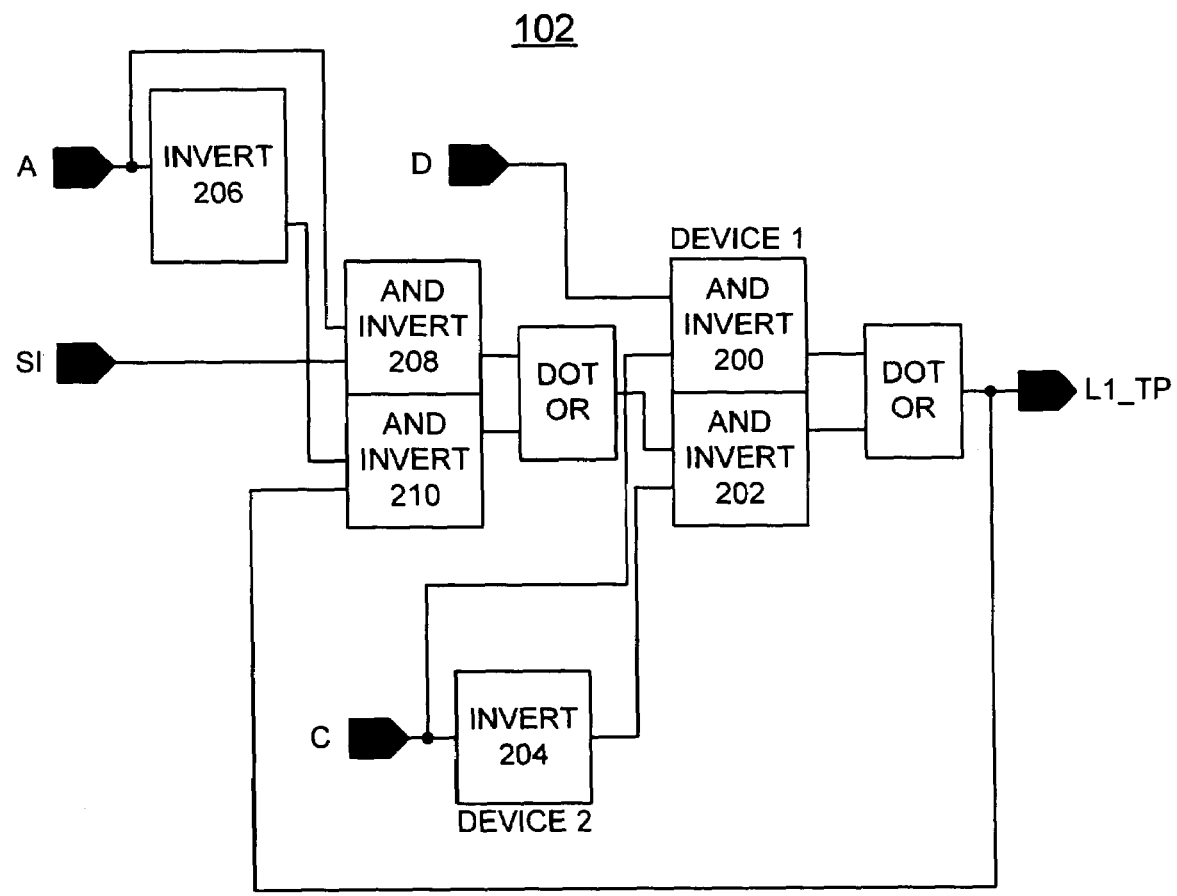
FIG. 2 is a block diagram of a L1 latch of the exemplary level sensitive scan design (LSSD) latch of FIG. 1 implemented in accordance with a method of the preferred embodiment.

FIG. 2 provides a block diagram of the L1 latch 102 of the LSSD latch 100 implemented in accordance with a method of the preferred embodiment. The only logic blocks in the critical path between C, D and L1_TP are labeled as Device 1 and Device 2. Device 1 includes a first and second logic block labeled AND INVERT 200, 202. Device 2 includes a logic block labeled INVERT 204. The two critical path logic blocks Device 1, Device 2 including blocks 200, 202, 204 are the only logic blocks to be powered up or implemented by a substitution of LVT transistors in the place of RVT transistors. Using LVT devices in any of a plurality of other non-critical sections or blocks 206, 208, 210 of the L1 latch 102 would only increases leakage current power with no improvement in functional performances. RVT transistors or LLD transistors implement the other non-critical path logic blocks 206, 208, 210 of the L1 latch 102.

Figure 3:
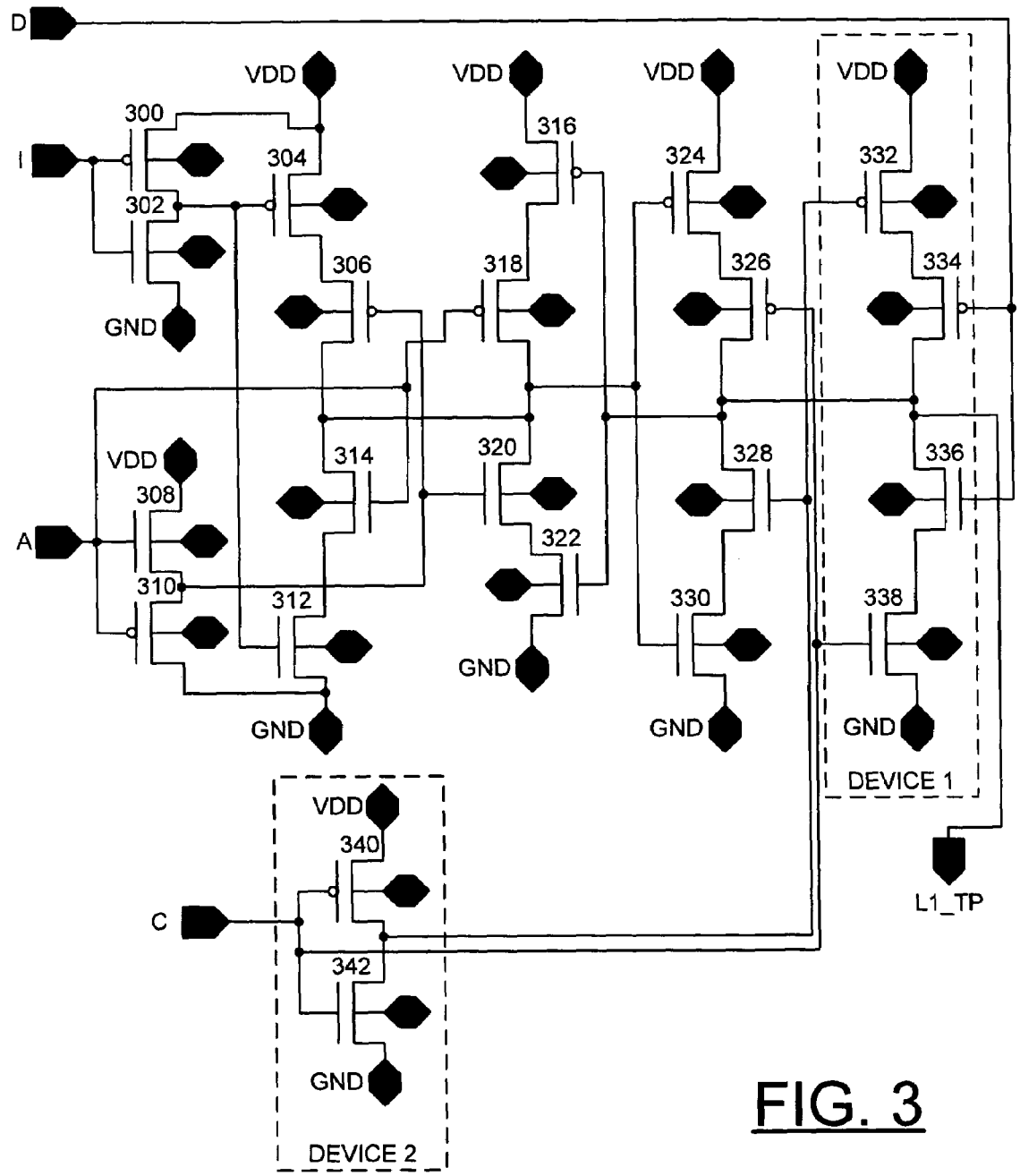
FIG. 3 is a schematic diagram of a L1 latch of the exemplary level sensitive scan design (LSSD) latch of FIG. 1 implemented in accordance with a method of the preferred embodiment.

Referring now FIG. 3, there is shown a schematic diagram of the L1 latch 102 of the LSSD latch 100 implemented in accordance with a method of the preferred embodiment. The non-critical sections or blocks including the invert 206, 208, 210 of the L1 latch 102 are formed by a plurality of transistors including PFETs 300, 304, 306, 310, 316, 318, 324, 326, NFETs 302, 308, 312, 314, 320, 322, 228, 330. Device 1 includes a pair of P-channel transistors 332, 334 and a pair of N-channel transistors 336, 338 forming the AND INVERT functions 200, 202. Device 2 includes a PFET 340 and an NFET 342 forming the inverter 204. The PFETs 332, 334, 340 and NFETs 336, 338, 342 that form the two critical path logic blocks Device 1 and Device 2 are the only transistors in the L1 latch 102 which are implemented by LVT devices to gain enhanced performance. The remaining PFETs 300, 304, 306, 310, 316, 318, 324, 326, NFETs 302, 308, 312, 314, 320, 322, 228, 330 are implemented by RVT transistors or LLD transistors.

Figure 4:
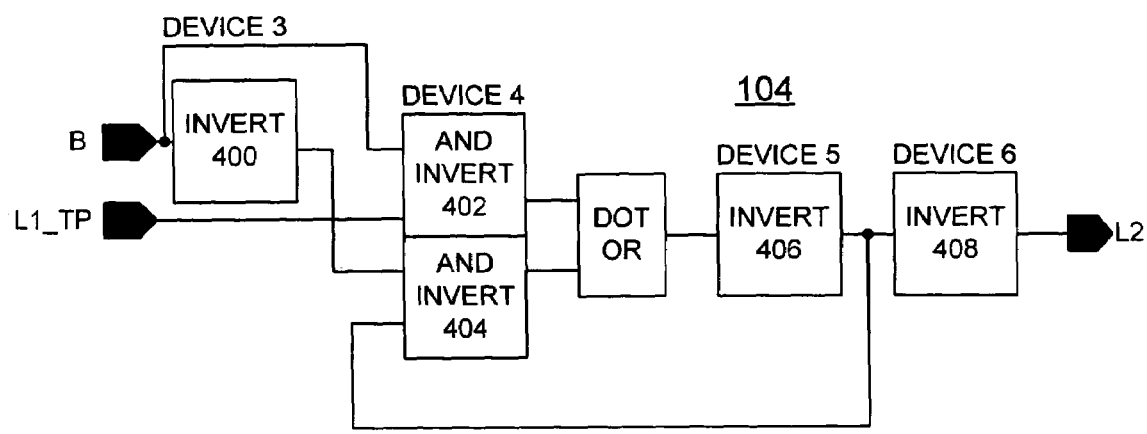
FIG. 4 is a block diagram of a L2 latch of the exemplary level sensitive scan design (LSSD) latch of FIG. 1 implemented in accordance with a method of the preferred embodiment.

FIG. 4 provides a block diagram of the L2 latch 104 of the LSSD latch 100 implemented in accordance with a method of the preferred embodiment. L2 latch 104 includes a plurality of logic blocks labeled Devices 3, 4, 5 and 6 that are in a critical path. As shown in FIG. 4, Device 3 includes an invert 400, Device 4 includes a first and second AND INVERT 402, 404, Device 5 includes an invert 406, and Device 6 includes an invert 408. Devices 3, 4, 5 and 6 are in the critical path between the clock B and L1_TP signals and the L2 output and need to be converted to LVT devices in accordance with a method of the preferred embodiment. It can be seen that the L2 latch 104 needs a majority of its devices modified while the L1 latch 102 only needs slight modification.

Figure 5:
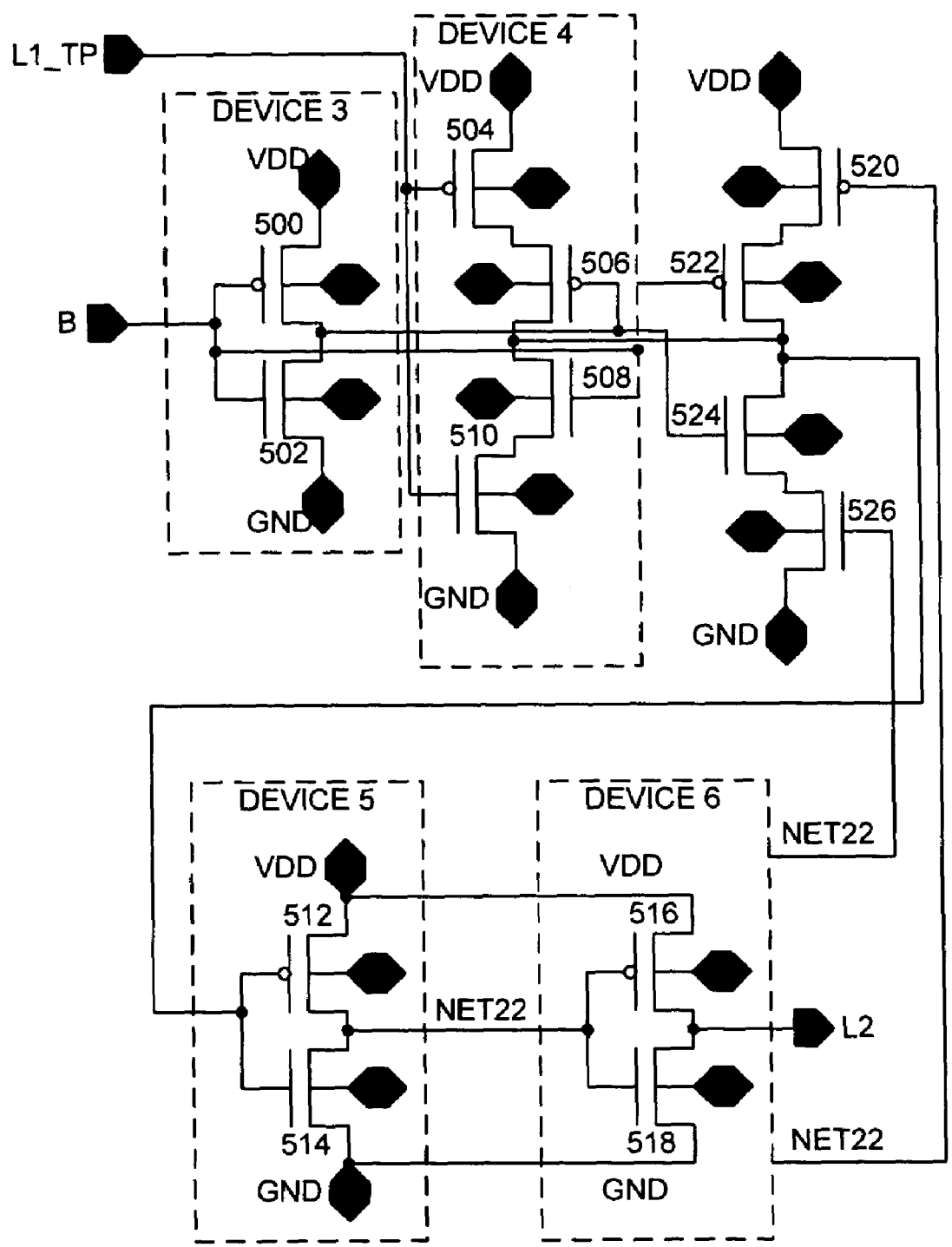
FIG. 5 is a schematic diagram of a L2 latch of the exemplary level sensitive scan design (LSSD) latch of FIG. 1 implemented in accordance with a method of the preferred embodiment.

Referring now FIG. 5, there is shown a schematic diagram of the L2 latch 104 of the LSSD latch 100 implemented in accordance with a method of the preferred embodiment. LVT devices to gain enhanced performance implement each of the transistors forming the critical path Devices 3, 4, 5 and 6. As shown in FIG. 5, critical path Device 3 includes a PFET 500 and an NFET 502 forming the invert 400. Critical path Device 4 includes a pair of PFETs 504, 506 and a pair of NFETs 508, 510 forming the first and second AND INVERT 402, 404, as shown. As shown, critical path Device 5 includes a PFET 512 and an NFET 514 forming the invert 406. As shown, critical path Device 4 includes a PFET 516 and an NFET 518 forming the invert 408.

A plurality of transistors including a pair of PFETs 520, 522 and a pair of NFETs 524, 526, form the non-critical sections and are selectively implemented by RVT transistors or LLD transistors.

Figure 6:
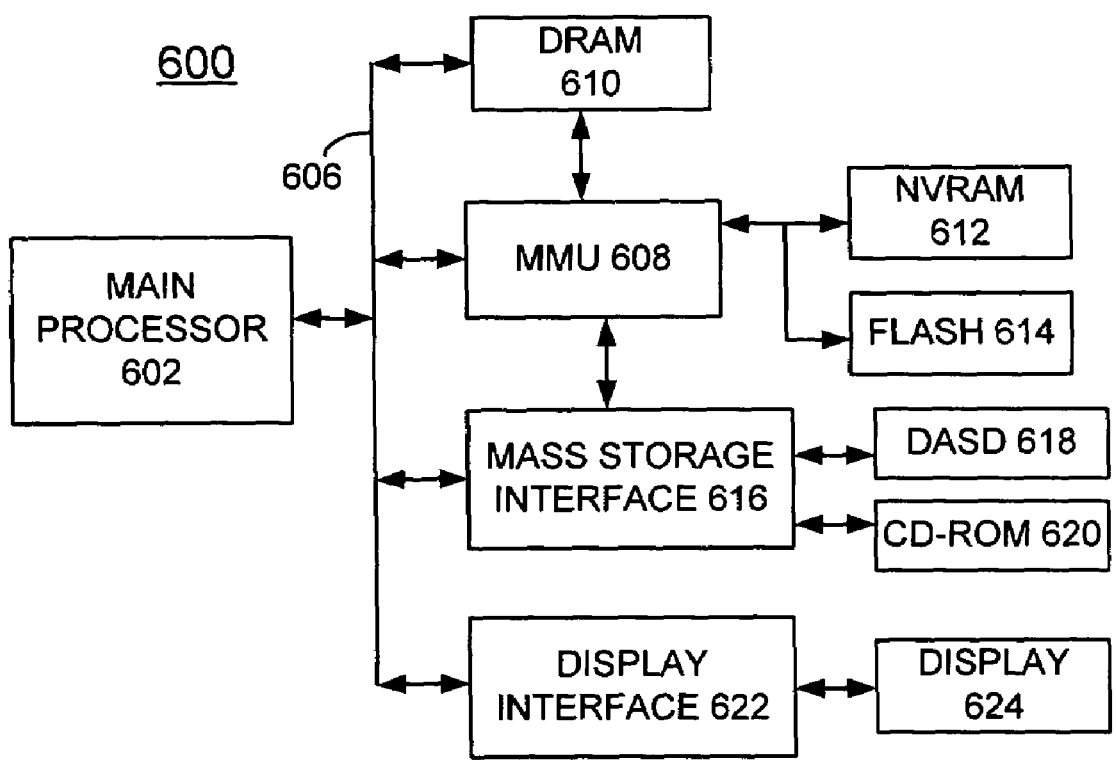

Referring now to the drawings, in FIGS. 6 and 7 there is shown a computer system generally designated by the reference character 600 for implementing enhanced performance with reduced quiescent power dissipation using mixed threshold CMOS devices in a latch circuit in accordance with the preferred embodiment. Computer system 600 includes a main processor 602 or central processor unit (CPU) 602 coupled by a system bus 106 to a memory management unit (MMU) 608 and system memory including a dynamic random access memory (DRAM) 610, a nonvolatile random access memory (NVRAM) 612, and a flash memory 614. A mass storage interface 616 coupled to the system bus 606 and MMU 608 connects a direct access storage device (DASD) 618 and a CD-ROM drive 620 to the main processor 602. Computer system 600 includes a display interface 622 coupled to the system bus 606 and connected to a display 624.

Computer system 600 is shown in simplified form sufficient for understanding the present invention. The illustrated computer system 600 is not intended to imply architectural or functional limitations. The present invention can be used with various hardware implementations and systems and various other internal hardware devices, for example, multiple main processors.

As shown in FIG. 7 computer system 600 includes an operating system 630, an electronic package design program 632, a mixed threshold CMOS devices latch design program 634 of the preferred embodiment, and a user interface 636.

Referring now to FIG. 8, there are shown exemplary steps for implementing enhanced performance with reduced quiescent power dissipation using mixed threshold CMOS devices in a latch circuit in accordance with the preferred embodiment. As indicated in a block 800, logic blocks in critical data and clock paths are identified. LVT transistors are substituted in the identified logic block in the critical data and clock paths in the place of RVT transistors as indicated in a block 802. RVT or LLD transistors are selectively provided to implement non-critical sections of the latch circuit as indicated in a block 804. RVT transistors are selectively provided for output buffer transistors as indicated in a block 806.

Referring now to FIG. 9, an article of manufacture or a computer program product 900 of the invention is illustrated. The computer program product 900 includes a recording medium 902, such as, a floppy disk, a high capacity read only memory in the form of an optically read compact disk or CD-ROM, a tape, a transmission type media such as a digital or analog communications link, or a similar computer program product. Recording medium 902 stores program means 904, 906, 908, 910 on the medium 902 for carrying out the methods for implementing enhanced performance with reduced quiescent power dissipation using mixed threshold CMOS devices in latch circuit designs of the preferred embodiment in the system 600 of FIGS. 6 and 7.

A sequence of program instructions or a logical assembly of one or more interrelated modules defined by the recorded program means 904, 906, 908, 910, direct the computer system 600 for implementing enhanced performance with reduced quiescent power dissipation using mixed threshold CMOS devices in latch circuit designs of the preferred embodiment.

It should be understood that the illustrated LSSD latch of FIGS. 1–5 is only one latch of many varieties of latches that can be improved with by the latch design method of the invention. More generally it should be understood that the latch design method of the invention advantageously is used for clock splitters and clock pulsers, where only critical paths need to be implemented using LVT transistors to achieve maximum performance with reduced power due to reduced leakage current.

While the present invention has been described with reference to the details of the embodiments of the invention shown in the drawing, these details are not intended to limit the scope of the invention as claimed in the appended claims.

What is claimed is:

1. A method for implementing enhanced performance with reduced quiescent power dissipation using mixed threshold CMOS devices in latch circuit designs including level sensitive scan design (LSSD) latches comprising the steps of:

identifying logic blocks in critical data and data clock paths of a L1 latch and a L2 latch of a LSSD latch;
substituting a low voltage threshold (LVT) transistor to replace each regular voltage threshold (RVT) transistor used in said identified logic blocks in the critical data and data clock paths of said L1 latch and said L2 latch of said LSSD latch; and
selectively implementing non-critical sections of said L1 latch and said L2 latch of said LSSD latch including scan input and scan clock paths only with RVT transistors, or low leakage (LLD) transistors.

2. A method for implementing enhanced performance with reduced quiescent power dissipation as recited in claim 1 wherein said LSSD latch includes output buffer transistors, and further includes the steps of providing RVT transistors to implement said output buffer transistors.

3. A method for implementing enhanced performance with reduced quiescent power dissipation as recited in claim 1 wherein said LSSD latch includes logic blocks used in loading data into said L1 latch of said LSSD latch and wherein the step of identifying logic blocks in critical data and data clock paths includes the steps of identifying said logic blocks used in loading data into said L1 latch of said LSSD latch.

4. A method for implementing enhanced performance with reduced quiescent power dissipation as recited in claim 3 wherein said LSSD latch includes logic blocks used in each data clock stage of said LSSD latch and includes the steps of identifying said logic blocks used in each data clock stage.

5. A method for implementing enhanced performance with reduced quiescent power dissipation as recited in claim 1 wherein said LSSD latch includes logic blocks used only during testing of said LSSD latch and wherein the step of selectively implementing non-critical sections of said L1 latch and said L2 latch of said LSSD latch including scan input and scan clock paths only with RVT transistors, or low leakage (LLD) transistors includes the steps of identifying said logic blocks used only during testing of said LSSD latch; and selectively implementing said logic blocks used only during testing only with RVT transistors, or low leakage (LLD) transistors.

6. A method for implementing enhanced performance with reduced quiescent power dissipation as recited in claim 1 wherein said LSSD latch includes logic blocks used to maintain the contents of latches of said LSSD latch and wherein the step of selectively implementing non-critical sections of said L1 latch and said L2 latch of said LSSD latch including scan input and scan clock paths only with RVT transistors, or low leakage (LLD) transistors includes the steps of identifying logic blocks used to maintain the contents of latches of said LSSD latch; and selectively implementing said logic blocks used to maintain the contents of latches only with RVT transistors, or low leakage (LLD) transistors.

7. A level sensitive scan desicin (LSSD) latch for implementing enhanced performance with reduced quiescent power dissipation comprising:

critical data and data clock paths of a L1 latch and a L2 latch of the LSSD latch;
non-critical sections of said L1 latch and said L2 latch of the LSSD latch;
a low voltage threshold (LVT) transistor being used only in said critical data and data clock paths and implementing each transistor in said critical data and data clock paths of said L1 latch and said L2 latch of the LSSD latch; and
said non-critical sections being implemented only with regular voltage threshold (RVT) transistors, or low leakage (LLD) transistors.

8. A latch circuit for implementing enhanced performance with reduced quiescent power dissipation as recited in claim 7 wherein said LSSD latch includes output buffer transistors, and includes said RVT transistors used for said output buffer transistors.

9. A latch circuit for implementing enhanced performance with reduced quiescent power dissipation as recited in claim 7 wherein said critical data and clock paths include multiple critical path logic blocks, each critical path logic block implemented with said LVT transistors.

10. A latch circuit for implementing enhanced performance with reduced quiescent power dissipation as recited in claim 7 wherein said non-critical sections include logic blocks used for testing and to maintain the contents of latches in the latch circuit.

11. A computer program product for implementing enhanced performance with reduced quiescent power dissipation using mixed threshold CMOS devices in latch circuit designs including level sensitive scan design (LSSD) latches in a computer system, said computer program product including instructions executed by the computer system to cause the computer system to perform the steps of:
    identifying logic blocks in critical data and data clock paths of a L1 latch and a L2 latch of a LSSD latch;
    substituting a low voltage threshold (LVT) transistor to replace each regular voltage threshold (RVT) transistor used in said identified logic blocks in the critical data and clock paths data clock paths of said L1 latch and said L2 latch of said LSSD latch; and
    selectively implementing non-critical sections of said L1 latch and said L2 latch of said LSSD latch including scan input and scan clock paths only with RVT transistors, or low leakage (LLD) transistors.

12. A computer program product for implementing enhanced performance with reduced quiescent power dissipation as recited in claim 11 wherein said LSSD latch includes output buffer transistors, and further includes the steps of providing RVT transistors to implement said output buffer transistors.

13. A computer program product for implementing enhanced performance with reduced quiescent power dissipation as recited in claim 11 wherein said LSSD latch includes logic blocks used in loading data into said L1 latch of said LSSD latch and wherein the step of identifying logic blocks in critical data and data clock paths includes the steps of identifying said logic blocks used in loading data into said L1 latch of said LSSD latch.

14. A computer program product for implementing enhanced performance with reduced quiescent power dissipation as recited in claim 13 wherein said LSSD latch includes logic blocks used in a data clock stage of said LSSD latch and includes the steps of identifying said logic blocks used in said data clock stage.

15. A computer program product for implementing enhanced performance with reduced quiescent power dissipation as recited in claim 11 wherein said LSSD latch includes logic blocks used only during testing of said LSSD latch and wherein the step of selectively implementing non-critical sections of said L1 latch and said L2 latch of said LSSD latch including scan input and scan clock paths only with RVT transistors, or low leakage (LLD) transistors includes the steps of identifying said logic blocks used only during testing of said LSSD latch; and selectively implementing said logic blocks used only during testing only with RVT transistors, or low leakage (LLD) transistors.

16. A computer program product for implementing enhanced performance with reduced quiescent power dissipation as recited in claim 11 wherein said LSSD latch includes logic blocks used to maintain the contents of latches of said LSSD latch and wherein the step of selectively implementing non-critical sections of said L1 latch and said L2 latch of said LSSD latch including scan input and scan clock paths only with RVT transistors, or low leakage (LLD) transistors includes the steps of identifying logic blocks used to maintain the contents of latches of said LSSD latch; and selectively implementing said logic blocks used to maintain the contents of latches only with RVT transistors, or low leakage (LLD) transistors.

* * * * *